United States Patent [19]

Akiyama et al.

[11] Patent Number: 5,230,988
[45] Date of Patent: Jul. 27, 1993

[54] METHOD OF MAKING LITHOGRAPHIC PRINTING PLATE

[75] Inventors: Keiji Akiyama; Tadao Toyama, both of Shizuoka, Japan

[73] Assignee: Fuji Photo Film Co., Ltd., Minami-Ashigara, Japan

[21] Appl. No.: 848,854

[22] Filed: Mar. 10, 1992

[30] Foreign Application Priority Data

Mar. 12, 1991 [JP] Japan .................. 3-46932
Apr. 3, 1991 [JP] Japan .................. 3-71022

[51] Int. Cl.$^5$ .................. G03F 7/30; G03F 7/32; G03F 7/023
[52] U.S. Cl. .................. 430/302; 430/165; 430/166; 430/278; 430/309; 430/326; 430/331
[58] Field of Search .............. 430/302, 309, 331, 275, 430/276, 165, 166, 278, 326

[56] References Cited

U.S. PATENT DOCUMENTS

| | | | |
|---|---|---|---|
| 3,220,832 | 11/1965 | Uhlig . | |
| 3,468,725 | 9/1969 | Uhlig | 430/302 |
| 4,427,765 | 1/1984 | Mohr et al. | 430/166 |
| 4,650,739 | 3/1987 | Simon et al. | 430/165 |
| 4,689,272 | 8/1987 | Simon et al. | 430/302 |
| 4,898,803 | 2/1990 | Aoai et al. | 430/191 |
| 5,043,252 | 8/1991 | Akiyama et al. | 430/331 |

FOREIGN PATENT DOCUMENTS

0154200 2/1985 European Pat. Off. .
63-165183 7/1988 Japan .

*Primary Examiner*—Marion E. McCamish
*Assistant Examiner*—Janis L. Dote
*Attorney, Agent, or Firm*—Burns, Doane, Swecker & Mathis

[57] ABSTRACT

A method of making a lithographic printing plate comprises the steps of imagewise exposing to light a presensitized plate which comprises a hydrophilized substrate provided thereon with an organic layer comprising at least one compound selected from the group consisting of substituted or unsubstituted aliphatic or aromatic compounds represented by the following general formula:

$$R^1(PO(OH)_2)_n \qquad (I)$$

or $$R^1(PO(OH)(R^2))_n \qquad (II)$$

wherein n is 1 or 2, if n is 1, $R^1$ and $R^2$ each represents a substituted or unsubstituted alkyl, alkoxy, aryloxy, aryl, acyl or acyloxy group and if n is 2, $R^1$ represents a substituted or unsubstituted alkylene or arylene group and $R^2$ is the same as that defined above, and a positive-working light-sensitive layer comprising an o-quinondiazide compound and developing the exposed plate with an aqueous solution which contains at least one compound selected from the group consisting of alkali metal salts and ammonium salts of inorganic acids other than silicic acid, alkali metal hydroxides, ammonium hydroxide and water-soluble organic amine compounds. This method can provide a lithographic printing plate having good resistance to contamination and high printing durability. Further, even if developing treatment is performed for a long time with an automatic developing machine in this method, deposits and sludge are not produced.

18 Claims, No Drawings

METHOD OF MAKING LITHOGRAPHIC PRINTING PLATE

BACKGROUND OF THE INVENTION

The present invention relates to a method of making a lithographic printing plate and more specifically to a method of developing treatment of a positive-working presensitized plate for use in making a lithographic printing plate (hereinafter referred to as "PS plate" which comprises a hydrophilized aluminum substrate provided thereon with an intermediate layer and a positive-working light-sensitive layer comprising an o-quinonediazide compound as well as a PS plate to be treated by the method.

Recently, an aqueous sodium silicate solution or an aqueous potassium silicate solution is utilized relatively advantageously as a developer composition for positive-working PS plate having a light-sensitive layer containing an o-quinonediazide compound as a light-sensitive material on the surface of an aluminum substrate. This is because that developing properties and stabilities can be controlled easily by varying the content of the silicon oxide and sodium oxide (or potassium oxide) which are the components of sodium silicate (or potassium silicate) and the concentrations thereof. However, when treatment using an automatic developing machine is repeated using such kinds of developer compositions, there are such problems as the formation of water-insoluble scum and sludge due to silicon oxide at the bottom of a developer tank and clogging of spray pipes and nozzles. Further, such developer compositions separate out as water-insoluble silica on or around the developer bath by drying, during stopping of the developing machine, or spattering of the solution which cause a variety of troubles. Further, when such developer compositions are exhausted, silicon oxide deposits out in the form of gel by neutralization, which leads to environmental pollution.

Developer compositions free of silicon oxide have been studied several times. However, there are such problems that when a developer composition free of silicon oxide is used, non-image portions of the resulting printing plate are contaminated during printing due to insufficient hydrophilicity of the non-image portions, or a substrate is easily etched with an alkali component in the developer composition due to the absence of silicon oxide on the substrate surface so that the aluminum component of the substrate separates out in a large quantity and thus the developing property is greatly damaged.

To eliminate the foregoing drawbacks, there have been adopted various means for hydrophilization such as a treatment with an alkali metal silicate as disclosed in U.S. Pat. No. 3,181,461; a treatment with fluorozirconic acid as disclosed in Japanese Examined Patent Publication (hereinafter referred to as "J. P. KOKOKU") No. Sho 36-22063 (=U.S. Pat. No. 2,946,683); and a treatment with a polyvinylsulfonic acid as disclosed in U.S. Pat. No 3,276,868. These methods can ensure sufficient hydrophilization of non-image portions of a lithographic printing plate and can eliminate the problem of etching of a substrate with an alkali, but cannot ensure sufficient adhesion between the hydrophilized substrate and a light-sensitive composition subsequently applied thereto and for this reason, the resulting lithographic printing plate can provide only several thousand copies.

SUMMARY OF THE INVENTION

Accordingly, an object of the present invention is to provide a method of making lithographic printing plate, which does not cause troubles such as deposition of silicic acid and clogging of spray nozzles by build-up of scum and sludge even if the treatment with an automatic developing machine is performed for a long time.

Another object of the present invention is to provide a method of making a lithographic printing plate, which can alleviate the burden when exhausted solution of the developer composition is neutralized and which cause no environmental pollution.

A further object of the present invention is to provide a method for the development of a PS plate, suitable for making a light-sensitive lithographic printing plate which has high adhesion strength between image portions and an aluminum substrate and is excellent in printing durability.

A still further object of the present invention is to provide a method for the development of a PS plate which is excellent in developability and can provide a lithographic printing plate exhibiting high resistance to background contamination during printing operation.

A further object of the present invention is to provide a PS plate which can provide a lithographic printing plate having the foregoing excellent quality.

The inventors of this invention have conducted various studies to achieve the foregoing objects, have found out that the use of a hydrophilized aluminum substrate having an organic layer of a specific compound and a developer comprising a specific compound are effective for eliminating the foregoing drawbacks associated with the conventional methods and thus have completed the present invention.

According to the present invention, there is provided a method of making a lithographic printing plate. The method comprises the steps of imagewise exposing, to light, a positive-working PS plate comprising a hydrophilized aluminum substrate provided thereon with an organic layer which comprises at least one compound selected from the group consisting of substituted or unsubstituted aliphatic or aromatic compounds represented by the general formula: $R^1$ $(PO(OH)_2)_n$ or $R^1$ $(PO(OH)$ $(R^2))_n$ (wherein n is 1 or 2, if n is 1, $R^1$ and $R^2$ each represents a substituted or unsubstituted alkyl, alkoxy, aryloxy, aryl, acyl or acyloxy group and if n is 2, $R^1$ represents a substituted or unsubstituted alkylene or arylene group and $R^2$ is the same as that defined above) and a positive-working light-sensitive layer which comprises an o-quinonediazide compound; and then developing the imagewise exposed PS plate with an aqueous solution comprising at least one compound selected from the group consisting of alkali metal salts and ammonium salts of inorganic acids other than silicic acid, alkali metal hydroxides, ammonium hydroxide and water-soluble organic amine compounds.

DETAILED EXPLANATION OF THE INVENTION

The aluminum substrates used in the present invention are plate-like materials of pure aluminum or an aluminum alloy comprising aluminum and a trace amount of other elements such as silicon, iron, manganese, copper, magnesium, chromium, zinc, bismuth, nickel and/or titanium. The amount of the elements other than aluminum is at most 10% by weight. The aluminum substrate preferably used in the invention is a pure aluminum plate, but it is presently difficult to obtain a completely pure aluminum plate from the viewpoint of refining technique. Therefore, an aluminum plate containing other elements as low as possible is employed. The aluminum plate containing other elements in the order of the foregoing range can be used in the invention without any problem. In other words, the aluminum plates usable in the invention are not restricted to those having specific compositions and may be those commonly known and used in this art. Thus, any known and/or used aluminum materials such as JIS A1050, JIS A1100, JIS A1200, JIS A3103, JIS A3003 and JIS A3005 can be suitably used in the present invention, but the invention is not limited to specific materials. The aluminum plate used in the invention has a thickness in the order of about 0.1 to 0.5 mm.

Such an aluminum plate is optionally treated with an aqueous solution containing a surfactant or an aqueous alkaline solution to remove the rolling oil from the surface thereof.

The lithographic printing plate prepared by the method according to the present invention may be a single-sided or double-sided one. The single-sided and double-sided printing plates may be prepared by the same treatment and, therefore, the present invention will hereinafter be described while taking the single-sided one by way of example. First, an aluminum plate as a substrate for a PS plate is surface-roughened. Such surface-roughening treatments are, for instance, mechanical surface-roughening treatments, methods for electrochemically dissolving the surface and methods for chemically selectively dissolving the surface. The mechanical surface-roughening treatments can be carried out by any known methods such as ball graining, brush graining, blast graining and buff graining methods. In addition, the electrochemical surface-roughening treatment is, for instance, performed by passing an alternating or direct current through the aluminum plate in an electrolyte such as hydrochloric acid or nitric acid. Moreover, it is also possible to use a combination of these two kinds of methods as disclosed in Japanese Unexamined Patent Publication (hereinafter referred to as "J. P. KOKAI") No. Sho 54-63902 and U.S. Pat. Nos. 4,476,006 and 4,477,317.

The aluminum plate thus surface-roughened may optionally be subjected to alkali etching and neutralization treatments as described in U.S. Pat. No. 4,824,757.

The aluminum plate thus surface treated is then anodized. Any electrolyte can be used in the anodization treatment of an aluminum plate so far as they can form a porous anodized layer and generally include, for instance, sulfuric acid, phosphoric acid, oxalic acid, chromic acid or mixture thereof. The concentration of these electrolytes are appropriately determined depending on the kinds of the electrolytes selected.

The conditions for the anodization variously vary depending on the kinds of the electrolytes selected, but in general the anodization is preferably performed at an electrolyte concentration ranging from 1 to 80% by weight, an electrolyte temperature ranging from 5° to 70° C., a current density ranging from 5 to 60 A/dm$^2$ and a voltage ranging from 1 to 100 v for 10 seconds to 50 minutes.

Preferred is anodization using sulfuric acid as an electrolyte, especially under the conditions as disclosed in British Patent No. 1,412,768 or U.S. Pat. No. 4,211,619.

Most preferred anodization using an electrolyte comprising from 5 to 20% by weight of sulfuric acid and from 3 to 15% by weight of aluminum ions at a temperature of from 25° to 50° C. with a direct current having a current density of from 5 to 20 A/dm$^2$.

The amount of the anodized layer is preferably not less than 1.0 g/m$^2$ and more preferably 2.0 to 6.0 g/m$^2$. This is because if it is less than 1.0 g/m$^2$, the resulting lithographic printing plate has insufficient printing durability and the non-image portion thereof is easily damaged, which leads to the occurrence of so-called "contamination due to defects", i.e., the adhesion of ink to defects during printing operation.

After the foregoing treatments, the aluminum plate is then hydrophilized. The hydrophilization thereof can be carried out by any conventionally known method.

An example of the hydrophilization treatments used in the present invention is an alkali metal silicate treatment (such as an aqueous sodium silicate solution) treatment as disclosed in U.S. Pat. Nos. 2,714,066, 3,181,461, 3,280,734 and 3,902,734. In the method, a substrate is treated by immersing or electrolyzing in an aqueous solution of sodium silicate. Examples of other hydrophilization treatments are treatments with potassium fluorozirconate as disclosed in J. P. KOKOKU No. Sho 36-22063 and a treatment with polyvinyl phosphonic acid as disclosed in U.S. Pat. Nos. 3,276,868, 4,153,461 and 4,689,272. Among these treatments, most preferred are alkali metal silicate treatments.

After these hydrophilization treatments, the following organic layer is applied onto the aluminum plate by various method as will be detailed below.

The compounds used in the present invention is at least one member selected from the group consisting of (I) substituted or unsubstituted aliphatic or aromatic compounds represented by the general formula: $R^1(PO(OH)_2)_n$ (n is 1 or 2) and (II) substituted or unsubstituted aliphatic or aromatic compounds represented by the general formula: $R^1(PO(OH)(R^2))_n$ (n is 1 or 2), wherein if n is 1, $R^1$ and $R^2$ each represents a substituted or unsubstituted alkyl (preferably an alkyl having 1 to 14 carbon atoms), alkoxy (preferably an alkoxy having 1 to 14 carbon atoms), aryloxy (preferably an aryloxy having 6 to 10 carbon atoms), aryl (preferably an aryl having 6 to 10 carbon atoms), acyl (preferably an acyl having 1 to 14 carbon atoms) or acyloxy (preferably an acyloxy having 1 to 14 carbon atoms) group and if n is 2, $R^1$ represents a substituted or unsubstituted alkylene (preferably an alkylene having 1 to 14 carbon atoms) or arylene (preferably an arylene having 6 to 10 carbon atoms) group and $R^2$ is the same as that defined above, the substituents being selected from the group consisting of alkyl (only for aryl), aryl (only for alkyl), alkoxy, acyl, acyloxy, aryloxy, vinyl, hydroxyl, carboxyl, cyano and nitro groups and halogen atoms.

Examples of aryloxy groups include phenoxy, p-chlorophenoxy, p-methylphenoxy and pyridyl groups; examples of aryl groups are phenyl, o-tolyl, m-tolyl, p-tolyl and p-chlorophenyl; examples of acyl groups are formyl, acetyl, propionyl and benzoyl; and examples of acyloxy groups are acetoxy, propionyloxy and pivaloyloxy groups. The compounds of Formulas (I) and (II) may be in the form of salts. Examples of such salts are alkali metal salts such as potassium, sodium and lithium salts and calcium, cobalt, iron, nickel, manganese, magnesium, barium and copper salts.

Specific examples of these compounds are, for those of Formula (I), phenylphosphonic acid, phenylphosphate, naphthylphosphonic acid, naphthylphosphate, glycerophosphonic acid, glycerophosphate, p-nitrophenylphosphonic acid, p-nitrophenylphosphate, p-methoxyphenylphosphonic acid, p-methoxyphenylphosphate, p-hydroxyphenylphosphonic acid, p-hydroxyphenylphosphate, p-tolylphosphonic acid, p-tolylphosphate, p-acetylphenylphosphonic acid, p-acetylphenylphosphate, p-cyanophenylphosphonic acid, p-cyanophenylphosphate, m-chlorophenylphosphonic acid, m-chlorophenylphosphate, methylphosphonic acid, methylenediphosphonic acid, ethylphosphonic acid, ethylenediphosphonic acid, 2-carboxyethylphosphonic acid, phosphonoacetic acid, 2-phenylethylphosphonic acid, 2-hydroxyethylphosphonic acid, 1-hydroxyethane-1,1-diphosphonic acid, aminohexylphosphate, 2-methoxyethylphosphonic acid, 2-acetylethylphosphonic acid, glycine-N,N-bis(methylenephosphonic acid), phosphoserine, phospbothreonine and pyridoxal phosphate and, for those Formula (II), phenylphosphinic acid, naphthylphosphinic acid, diphenylphosphinic acid, dimethylphosphinic acid, p-nitrophenylphosphinic acid, p-methoxyphenylphosphinic acid, p-hydroxyphenylphosphinic acid, p-tolylphosphinic acid, p-acetylphenylphosphinic acid, bisnitrophenylphosphate, dioctyl phosphate, diisopropyl phosphate, dibutyl phosphate, dimethyl phosphate, diethyl phosphate, di-2 ethylhexyl phosphate, diphenyl phosphate, methylphosphinic acid, ethylphosphinic acid, diethylphosphinic acid, 2-carboxyethylphosphinic acid, 2-phenylethylphosphinic acid, 2-hydroxyethylphosphinic acid, 2-methoxyethylphosphinic acid and 2-acetylethylphosphinic acid.

These compounds may be used alone or in any combination. Among these, particularly preferred are phenylphosphonic acid, phenylphosphate, naphthylphosphonic acid, naphthylphosphate, phenylphosphinic acid, diphenylphosphinic acid and naphthylphosphinic acid.

In the present invention, the organic layer can be applied by the method comprising the steps of applying a solution of the foregoing compound in water, an organic solvent such as methanol or ethanol or a mixture thereof to the hydrophilized aluminum plate and then drying or a method comprising the steps of dipping the hydrophilized aluminum plate in a solution of the foregoing compound in water, an organic solvent such as methanol or ethanol or a mixture thereof to adsorb the compound on the plate, then washing with, for instance, water and drying. In the former, a coating solution containing the compound in a concentration ranging from 0.005 to 10% by weight can be applied by a variety of methods such as coating with a bar coater or whirler or curtain coating, while in the latter method, the concentration of the solution ranges from 0.01 to 20% by weight, preferably 0.05 to 5% by weight and the dipping temperature ranges from 20° to 90° C., preferably 25° to 50 ° C. and the dipping time ranges from 0.1 second to 20 minutes, preferably 2 seconds to one minute.

The coated amount (weighed after drying) of the organic layer ranges from 2 to 200 mg/m$^2$, preferably 5 to 100 mg/m$^2$. This is because, if the coated amount is less than 2 mg/m$^2$, the printing durability of the resulting lithographic printing plate is insufficient, while if it exceeds 200 mg/m$^2$, sufficient printing durability cannot likewise be obtained.

The coating solution for forming an organic layer may further comprise a basic substance such as ammonia, triethylamine or potassium hydroxide or an acidic substance such as hydrochloric acid or phosphoric acid to adjust the pH thereof to 1 to 12. Moreover, the coating solution may comprise a yellow dye for the improvement of the tone reproduction of the resulting PS plate.

The organic layer may also comprise phosphonic acids having amino groups such as carboxymethyl cellulose, dextrin, gum arabic and 2 aminoethylphosphonic acid; amino acids such as glycine and $\beta$-alanine; and/or hydrochlorides of amines having hydroxyl groups such as triethanolamine hydrochloride.

The organic layer used in the present invention preferably comprises the compound of Formulas (I) and/or (II) in an amount of at least 30% by weight, more preferably not less than 80% by weight and most preferably 100% by weight.

A PS plate can be obtained by applying a light-sensitive layer comprising a positive-working light-sensitive composition containing a known o-quinonediazide compound onto the aluminum plate provided thereon with the organic layer thus formed. Any compositions for light-sensitive layer can be used so far as they can change their solubility or swellability in a developer before and after exposure to light. Typical examples thereof will be explained below.

Preferred o-quinonediazide compounds are esters of 1,2-diazonaphthoquinonesulfonic acid chloride with pyrogallolacetone resin as disclosed in J. P. KOKOKU No. Sho 43-28403 (U.S. Pat. No. 3,635,709). Other preferred o-quinonediazide compounds are, for instance, esters of 1,2-diazonaphthoquinone-5-sulfonic acid chloride with phenol-formaldehyde resin as disclosed in U.S. Pat. Nos. 3,046,120 and 3,188,210; and esters of 1,2-diazonaphthoquinone-4-sulfonic acid chloride with phenol-formaldehyde resin as disclosed in J. F KOKAI Nos. Hei 2-96163, Hei 2-96165 and Hei 2-96761.

Examples of further preferred o-quinonediazide compounds include those known and disclosed in a variety of patents such as J. P. KOKAI Nos. Sho 47 5303, Sho 48-63802, Sho 48-63803, Sho 48-96575, Sho 49 38701 and Sho 48-13354, J. P. KOKOKU Nos. Sho 37-18015, Sho 41-11222, Sho 45-9610 and Sho 49-17481, U.S. Pat. Nos. 2,797,213; 3,454,400; 3,544,323; 3,573,917; 3,674,495 and 3,785,825; U.K. Patent Nos. 1,227,602; 1,251,345; 1,267,005; 1,329,888 and 1,330,932; and German Patent No. 854,890.

Particularly preferred o-naphthoquinonediazide compounds are those obtained through the reaction of polyhydroxy compounds having molecular weight of not more than 1,000 with 1,2-diazonaphthoquinonesulfonic acid chloride. Specific examples thereof are those disclosed in, for instance, J. P. KOKAI Nos. Sho 51-139402, Sho 58-150948, Sho 58-203434, Sho 59-165053, Sho 60-121445, Sho 60-134235, Sho 60-163043, Sho 61-118744, Sho 62-10645, Sho 62-10646, Sho 62-153950, Sho 62-178562 and Sho 64-76047; and U.S. Pat. Nos. 3,102,809; 3,126,281; 3,130,047; 3,148,983; 3,184,310; 3,188,210 and 4,639,406.

These o-naphthoquinonediazide compounds are preferably obtained by reacting polyhydroxy compounds with 1,2-diazonaphthoquinonesulfonic acid chloride in an amount ranging from 0.2 to 1.2 eq, more preferably 0.3 to 1.0 eq The 1,2-diazonaphthoquinonesulfonic acid chloride may be either 1,2-diazonaphthoquinone-5-sulfonic acid chloride or 1,2-diazonaphthoquinone-4-sulfonic acid chloride.

In this respect, the resulting o-naphthoquinonediazide compound is a mixture of products variously differing in the positions of 1,2-diazonaphthoquinonesulfonate groups and the amounts thereof introduced, but preferred are those having a rate of the compound whose hydroxyl groups are all converted into 1,2-diazonaphthoquinonesulfonic acid esters (content of the completely esterified compound) of not less than 5 mole %, more preferably 20 to 99 mole %.

The light-sensitive composition used in the invention preferably comprises the positive-working light-sensitive compounds (inclusive of the foregoing combination) in an amount ranging from 10 to 50% by weight, more preferably 15 to 40% by weight.

The positive-working light-sensitive composition may comprise only o-quinonediazide compounds such as those listed above, but preferably the o-quinonediazide compounds are used in combination with an alkaline water-soluble resin as a binder. Preferred examples thereof are alkaline water-soluble novolak resins such as phenol-formaldehyde resins and cresol-formaldehyde resins, for instance, o-, m- and p-cresol-formaldehyde resins, m-/p- mixed cresol-formaldehyde resins and phenol-mixed cresol (m-/ p-/o- or m-/p- or m-/o-)-formaldehyde resins.

Other binders usable in the invention further include phenol-modified xylene resins, polyhydroxystyrenes, halogenated polyhydroxystyrenes and acrylic resins having phenolic hydroxyl groups as disclosed in J. P. KOKAI No. Sho 51-34711. Examples of suitable binders may further include copolymers generally having a molecular weight of 10,000 to 200,000 and having structural units derived from the following monomers (1) to (13).

(1) (Meth)acrylamides, (meth)acrylic acid esters and hydroxystyrenes having an aromatic hydroxy group such as N-(4-hydroxyphenyl) (meth)acrylamide, o-, m- or p-hydroxystyrene and o-, m- or p-hydroxyphenyl-(meth)acrylate.

(2) (Meth)acrylic acid esters having an aliphatic hydroxy group such as 2-hydroxyethyl (meth)acrylate.

(3) Unsuturated carboxylic acids such as (meth)acrylic acid, maleic anhydride and itaconic acid.

(4) (Substituted) alkyl acrylates such as methyl acrylate, ethyl acrylate, propyl acrylate, butyl acrylate, amyl acrylate, hexyl acrylate, octyl acrylate, 2-chloroethyl acrylate, glycidyl acrylate and N-dimethylaminoethyl acrylate.

(5) (Substituted) alkyl methacrylates such as methyl methacrylate, ethyl methacrylate, propyl methacrylate, butyl methacrylate, amyl methacrylate, cyclohexyl methacrylate, 4-hydroxybutyl methacrylate, glycidyl methacrylate and N-dimethylaminoethyl methacrylate.

(6) (Meth)acrylamides such as (meth)acrylamide, N-methylol (meth)acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide. (7) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(8) vinyl esters such as vinyl acetate, vinyl chloro acetate, vinyl butyrate and vinyl benzoate.

(9) Styrenes such as styrene, α-methylstyrene and chloromethylstyrene.

(10) vinyl ketones such as methyl vinyl ketone, ethyl vinyl ketone, propyl vinyl ketone and phenyl vinyl ketone.

(11) Olefins such as ethylene, propylene, isobutylene, butadiene and isoprene.

(12) N-vinyl pyrrolidone, N-vinyl carbazole, 4-vinyl pyridine, acrylonitrile and methacrylonitrile.

(13) Unsaturated sulfonamides such as (meth)acrylamides, e.g., N-(o-aminosulfonylphenyl) (meth)acrylamide, N-(m-aminosulfonylphenyl) (meth)acrylamide, N-(p-a minosulfonylphenyl) (meth)acrylamide, N-(1-(3-aminosulfonyl) naphthyl) (meth)acrylamide and N-(2-aminosulfonylethyl) (meth) acrylamide; and (meth)acrylic acid esters, e.g., o-aminosulfonylphenyl (meth)acrylate, m-aminosulfonylphenyl (meth)acrylate, p-aminosulfonylphenyl (meth)acrylate and 1-(3-aminosulfonylnaphthyl) (meth)acrylate.

Further, the foregoing monomers may further be copolymerized with other monomers copolymerizable therewith and the copolymers of the monomers listed above can be modified with, for instance, glycidyl (meth)acrylate. However, the copolymers usable in the invention are not limited to these specific examples.

The foregoing copolymers preferably comprises moieties derived from the unsaturated carboxylic acids (3) listed above and the carboxylic acid value thereof preferably ranges from 0 to 4 meq/g, more preferably 0.5 to 2.5 meq/g. Moreover, preferred molecular weight of these copolymers ranges from 10,000 to 100,000.

The copolymers, if desired, may comprise polyvinyl butyral resin, polyurethane resin, polyamide resin and/or epoxy resin. These alkali-soluble polymers may be used alone or in combination and the amount thereof is not more than 80% by weight on the basis of the total weight of the composition.

Further it is also preferred to simultaneously use condensates of phenols having $C_3$ to $C_8$ alkyl groups as substituents with formaldehyde such as t-butylphenol-formaldehyde resin, octylphenol-formaldehyde resin as disclosed in U.S. Pat. No. 4,123,279 for the improvement in the ink-receptivity of images.

The light-sensitive composition used in the invention preferably comprises, for the improvement of sensitivity, cyclic acid anhydrides, phenols and/or organic acids. Examples of such cyclic acid anhydrides are phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride. Such phenols include, for instance, bisphenol A, p-nitrophenol, p-ethoxyphenol, 2,3,4-trihydroxybenzophenone, 4-hydroxybenzophenone, 2,4,4'-trihydroxybenzophenone, 4,4',4''-trihydroxy-triphenylmethane and 4,4',3'',4''-tetrahydroxy-3,5,3',5'-tetramethyl-triphenylmethane. Such organic acids are, for instance, sulfonic acids, sulfinic acids, alkylsulfuric acids, phosphonic acids, phosphinic acids, phosphoric acid esters and carboxylic acids as disclosed in J. P. KOKAI Nos. Sho 60-88942 and Hei 2-96755 and specific examples thereof are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3, 4-dimethoxybenzoic acid, phthalic acid, terephthalic acid, 1,4-cyclohexene-2,2-dicarboxylic acid, erucic acid, lauric acid, n-undecanoic acid and ascorbic acid.

The content of the foregoing cyclic acid anhydrides, phenols and/or organic acid in the light-sensitive composition preferably ranges from 0.05 to 15% by weight and more preferably 0.1 to 5% by weight.

The composition used in the invention may further comprise, for extending the development latitude, non-ionic surfactants as disclosed in J. P. KOKAI No. Sho 62-251740 and/or amphoteric surfactants as disclosed in J. P. KOKAI No. Sho 59-121044 and Hei 4-13149. Specific examples of non-ionic surfactants are sorbitan tristearate, sorbitan monopalmitate, sorbitan trioleate, srearyl monoglyceride, polyoxyethylene sorbitan monooleate and polyoxyethylene nonylphenyl ether and examples of amphoteric surfactants are alkyl di(aminoethyl)glycine, alkyl polyaminoethyl glycine hydrochloride, Aqueous Amorgen (trade name of an N-tetradecyl-N,N-betaine type surfactant, available from Dai-Ichi Kogyo Seiyaku Co., Ltd.), 2-alkyl-N-carboxyethyl-N-hydroxyethyl imidazolinium betaine and Rebon 15 (trade name of an alkyl imidazoline type one available from Sanyo Chemical Industries, Ltd.).

The content of the foregoing non-ionic and/or amphoteric surfactants in the composition ranges from 0.05 to 15% by weight and more preferably 0.1 to 5% by weight.

The light-sensitive composition used in the invention may comprise a printing out agent for obtaining a visible image immediately after exposure to light, a dye for coloring images and other fillers. A representative example of the printing out agent is a combination of a light-sensitive compound capable of releasing an acid through exposure to light with a salt-forming organic dye, for instance, a combination of o-naphthoquinonediazido-4-sulfonic acid halide with a salt-forming organic dye as disclosed in J. P. KOKAI Nos. Sho 50-36209 (=U.S. Pat. No. 3,969,118) and Sho 53-8128; and a combination of a trihalomethyl compound with a salt-forming organic dye as disclosed in J. P. KOKAI Nos. Sho 53-36223 (=U.S. Pat. No. 4,160,671), Sho 54-74728 (=U.S. Pat. No. 4,232,106), Sho 60-3626, Sho 60-138539, Sho 61-143748, Sho 61-151644 and Sho 63-58440 (=U.S. Pat. No. 5,064,741). Such trihalomethyl compounds include oxadiazole and triazine type compounds and both of these are excellent in stability with time and can provide clear printed out images.

Other dyes may also be used instead of or together with the foregoing salt-forming organic dyes as the agents for coloring images. Preferred dyes inclusive of the salt-forming organic dyes are, for instance, oil-soluble and basic dyes. Specific examples thereof are Oil Yellow #101 and #130, Oil Pink #312, Oil Green BG, Oil Blue BOS and #603, Oil Black BY, BS and T-505 (they are all available from Orient Chemical Industries, Co., Ltd.), Victoria Pure Blue, Crystal Violet (CI 42555), Methyl Violet (CI 142535), Ethyl Violet, Rhodamine B (CI 45170B), Malachite Green (CI 42000) and Methylene Blue (CI 52015). Particularly preferred are those disclosed in J. P. KOKAI No. Sho 62-293247 (=GB 2192729).

The light-sensitive composition used in the invention is dissolved in a solvent and then applied onto a substrate. Examples of solvents usable are ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene, ethyl acetate, methyl lactate, ethyl lactate, dimethylsulfoxide, dimethylacetamide, dimethylformamide, water, N-methylpyrrolidone, tetrahydrofurfuryl alcohol, acetone, diacetone alcohol, methanol, ethanol, isopropanol and diethylene glycol dimethyl ether, which may be used alone or in combination. The concentration (solid content) of the foregoing ingredients ranges from 2 to 50% by weight. The amount of the composition to be applied varies depending on the applications, but preferably it in general ranges from 0.5 to 3.0 g/m$^2$ (solid content). This is because, as the coated amount of the composition is reduced, the light-sensitivity increases, but physical properties of the light-sensitive layer are lowered.

The light-sensitive composition may comprise a surfactant such as a fluorine atom-containing surfactant as disclosed in J. P. KOKAI No. Sho 62-170950 (=U.S. Pat. No. 4,822,713) for improving the coating properties thereof. The amount thereof to be added preferably ranges from 0.01 to 1% by weight, more preferably 0.05 to 0.5% by weight on the basis of the total weight of the composition.

The surface of the resulting light-sensitive layer is preferably matted to reduce the time required for evacuation during close contact exposure using a vacuum printing frame and to prevent an image becoming indistinct. Examples of methods for matting are those disclosed in J. P. KOKAI No. Sho 50-125805 (=U.S. Pat. No. 4,268,611) and J. P. KOKOKU Nos. Sho 57-6582 (=U.S. Pat. No. 4,288,526) and Sho 61-28986 (=U.S. Pat. No. 4,626,484) in which a mat layer is formed and those disclosed in J. P. KOKOKU No. Sho 62-62337 (=U.S. Pat. No. 5,028,512) which comprise heat-welding solid powder to the surface.

Examples of salts of inorganic acids other than silicic acid used in the developer used in the present invention include sodium tertiary phosphate, potassium tertiary phosphate, ammonium tertiary phosphate, sodium secondary phosphate, potassium secondary phosphate, ammonium secondary phosphate, ammonium bicarbonate, sodium carbonate, potassium carbonate, ammonium carbonate, sodium bicarbonate, potassium bicarbonate, sodium borate, potassium borate and ammonium borate. Examples of alkali metal hydroxides are potassium hydroxide, sodium hydroxide, lithium hydroxide and ammonium hydroxide. Particularly preferred are bicarbonates and carbonates and most preferred is a combination of a bicarbonate and a carbonate. These salts may be employed alone or in combination.

Examples of water-soluble organic amine compounds added to the developer used in the present invention include monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine and pyridine. Among these, particularly preferred are monoethanolamine, diethanolamine and triethanolamine which may be used in combination with inorganic alkali metal salts.

The concentration of these basic compounds in an aqueous solution preferably ranges from 0.05 to 10% by weight. These compounds are more preferably used in an amount such that the pH value of the aqueous solution is less than 11 preferably more than 9 but less than 11 to make easy the handling thereof and neutralization process during plate making.

The developer used in the present invention may optionally comprise at least one anionic surfactant. Moreover, it is also possible to add an organic solvent to the developer. Examples of the anionic surfactants are sodium salt of lauryl alcohol sulfate; sodium salt of octyl alcohol sulfate; ammonium salt of lauryl alcohol sulfate; salts of higher alcohol sulfuric acid esters having 8 to 22 carbon atoms such as disodium salts of alkylsulfates; salts of aliphatic alcohol phosphoric acid esters such as sodium salt of cetyl alcohol phosphoric acid ester; salts of alkylarylsulfonic acids such as sodium dodecylbenzenesulfonate, sodium isopropylnaphthalenesulfonate and sodium metanitrobenzenesulfonate; sulfonic acid salts of alkylamides such as $C_{17}H_{33}CON(CH_3)CH_2CH_2SO_3Na$; and sulfonic acid salts of dibasic aliphatic acid esters such as sodium dioctyl sulfosuccinate and sodium dihexyl sulfosuccinate.

These anionic surfactants are used in the developer in an amount suitably ranging from 0.1 to 5% by weight based on the total weight of the developer practically employed. This is because if it is less than 0.1% by weight, the effect thereof cannot be expected, while if it exceeds 5% by weight, for instance, dyes contained in image portions are dissolved out in excess and the mechanical and chemical strength such as wear resistance of the image portions are deteriorated.

The organic solvents which may be added to the developer are preferably selected from those having solubility in water of not more than about 10% by weight, in particular not more than 5% by weight. Examples of the organic solvent include 1-phenylethanol, 2-phenylethanol, 3-phenylpropanol-1,4-phenylbutanol-1, 4-phenylbutanol-2, 2-phenylbutanol-1, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol.

The amount of the organic solvents preferably ranges from 1 to 5% by weight with respect to the total weight of the developer practically employed. The amount of the organic solvent is closely related to that of the surfactant. More specifically, the amount of the anionic surfactant should be increased with the increase in that of the organic solvent. This is because if the amount of the anionic surfactant is low and that of the organic solvent is great, the organic solvent is not solubilized in water and as a result, good developing properties of the composition cannot be ensured.

The developer used in the invention may optionally comprise additives such as antifoaming agents and/or water softeners. Examples of water softeners include polyphosphates such as $Na_2P_2O_7$, $Na_5P_3O_3$, $Na_3P_3O_9$, $Na_2O_4P(NaO_3P)$ $PO_3Na_2$ and Calgon (trade name of sodium polymetaphosphate, available from Calgon Inc. (U.S.A.)); Polyaminocarboxylic acids and salts thereof such as ethylenediamine-tetraacetic acid and potassium and sodium salts thereof, diethylene-triaminepentaacetic acid and potassium and sodium salts thereof, triethyl enetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminoc yclohexanetetraacetic acid and potassium and sodium salts thereof and 1,3-diamino-2-propanoltetraacetic acid and potassium and sodium salts thereof.

The optimum amount of the water softener varies depending on the hardness and the amount of hard water used, but the amount thereof in general ranges from 0.01 to 5% by weight and preferably 0.01 to 0.5% by weight on the basis of the total weight of the developer practically used.

Appropriate light sources for exposure are carbon arc lamps, mercury lamps, xenon lamps, tungsten lamps and metal halide lamps.

In the plate-making process of the invention, a PS plate which have been developed can be washed with water and then desensitized; or desensitized without water-washing; or treated with an aqueous solution containing an acid; or treated with an aqueous solution of an acid and then desensitized, as disclosed in J. P. KOKAI Nos. 54-8002, Sho 55-115045 (=U.S. Pat. No. 4,291,117) and Sho 59-58431. Moreover, the developer is exhausted as the increase in the quantity of PS plates processed in the process for the development of a PS plate of this kind and, therefore, a replenisher or a fresh developer may be supplemented to recover the processing ability thereof. In this case, the replenishment is preferably performed in the manner as disclosed in U.S. Pat. No. 4,882,246.

The plate-making treatment as described above is preferably carried out in an automatic developing machine as disclosed in J. P. KOKAI Nos. Hei 2-7054 (=U.S. Pat. No. 4,952,958) and Hei 2-32357.

When undesirable portions of images are eliminated after imagewise exposing a PS plate, developing the exposed PS plate and then washing or rinsing with water, it is preferred to use an erasing solution as disclosed in J. P. KOKOKU No. Hei 2-13293 (=U.S. Pat. No. 4,396,703). Desensitizing gums optionally applied onto the processed PS plate in the final step of the plate-making process are preferably those disclosed in J. P. KOKOKU Nos. Sho 62-16834 (=U.S. Pat. No. 4,348,954), Sho 62-25118 (=U.S. Pat. No. 4,268,613) and Sho 63-52600 and J. P. KOKAI Nos. Sho 62-7595 (=U.S. Pat. No. 4,731,119), Sho 62-11693 (=U.S. Pat. No. 4,719,172) and Sho 62-83194 (=U.S. Pat. No. 4,762,772).

Moreover, if, after imagewise exposing a PS plate, developing the exposed PS plate, then washing or rinsing with water, optionally erasing and then washing with water, the processed PS plate is burned, it is preferred to treat the surface of the plate with a surface conditioning solution as disclosed in J. P. KOKOKU Nos. Sho 61-2518 (=U.S. Pat. No. 4,294,910) and Sho 55-28062 (=U.S. Pat. No. 4,063,507) and J. P. KOKAI Nos. Sho 62-31859 (=U.S. Pat. No. 4,762,771) and Sho 61-159655.

According to the present invention, even if a developing treatment is carried out for a long time with an automatic developing machine, deposits and sludge are not produced and the exhausted developer solution can be neutralized easily. Further, developing property is good and the resulting lithographic printing plate has excellent printing durability and the non-image portion thereof exhibits good resistance to contamination.

The present invention will hereunder be described in more detail in reference to the following non-limitative working Examples and the effects practically attained by the invention will also be discussed in detail. In the following Examples and Comparative Examples, the term "%" means "% by weight" unless otherwise specified.

EXAMPLES 1 TO 3 AND COMPARATIVE EXAMPLES 1 TO 3

A JIS A 1100 aluminum plate having a thickness of 0.15 mm was immersed in a 10% aqueous solution of sodium tertiary phosphate maintained at 80° C. for 30 seconds to degrease the plate. After the plate was grained with a nylon brush while a slurry of pumice stone was flowing on the plate, it was etched with an aqueous solution of sodium aluminate maintained at 60° C. for 10 seconds and then washed with a 3% aqueous solution of sodium hydrogensulfate. Subsequently, the aluminum plate was anodized in a 20% sulfuric acid solution for 2 minutes at a current density of 2 A/dm$^2$ and then treated with a 2.5% aqueous solution of sodium silicate at 70° C. for one minute to give an aluminum substrate A. The following underlying coating solution (I) was applied to the surface of aluminum substrate A thus treated and dried at 90° C. for one minute. The coated amount (weighed after drying) of the solution was 20 mg/m$^2$.

| (I) Underlying Coating Solution (I) | |
|---|---|
| phenyl phosphate | 0.1 g (Example 1) |
| methanol | 95 g |
| water | 5 g |

In the same manner, substrates were prepared by applying, to substrates A, underlying coating solutions having the same compositions as that of solution (I) except that phenyl phosphonic acid (Example 2) or phenyl phosphinic acid (Example 3) was substituted for the phenyl phosphate used in Example 1, in coated amounts of 20 mg/m$^2$ respectively.

Separately, substrates which had been processed in the same manner used above except that the sodium silicate treatment was omitted (substrate B) were used without applying any underlying coating as comparative samples (Comparative Examples 1 and 3). Moreover, substrate A per se was used without applying any underlying coating as a comparative sample (Comparative Example 2). Then a solution of light-sensitive composition (hereunder referred to as "light-sensitive solution") A having the following composition was applied onto the substrates thus obtained.

| Light-sensitive solution A Component | Amount (part by weight) |
|---|---|
| Ester of 2,3,4-trihydroxybenzophenone and naphthoquinone-1,2-diazide-5 sulfonyl chloride (rate of esterification: 90 mol %) | 0.47 |
| Phenol-formaldehyde resin (weight-average molecular weight: 2,300) | 1.15 |
| 2-(p-Methoxyphenyl)-4,6-bis(trichloromethyl)-s-triazine | 0.02 |
| Naphthoquinone-1,2-diazide-4-sulfonyl chloride | 0.01 |
| Victoria Pure Blue BOH (a dye available from Hodogaya Chemical Co., Ltd.) | 0.016 |
| Megafac F-176 (fluorine atom-containing surfactant available from Dainippon Ink Chemical Industry Co., ltd.) | 0.004 |
| Methyl ethyl ketone | 12 |
| Ethanol | 4 |
| Ethylene dichloride | 4 |

The coated amount thereof was 2 g/m$^2$ (determined after drying). The PS plate was imagewise exposed to light from a 30A carbon arc lamp at a distance of 70 cm for 45 seconds and then developed with the developer A (pH≈10.5) or B (pH≈13) containing the following components with an automatic developing machine at 25° C. for 30 seconds.

| Component | Amount (part by weight) |
|---|---|
| Developer A: Stock Solution (which is diluted with water at a rate of 1:4 prior to use) | |
| Water | 75 |
| Potassium hydrogencarbonate | 3.5 |
| Potassium carbonate | 7 |
| Pelex NBL (available from Kao Atlas Co., Ltd.) | 15 |
| Phenoxy ethanol | 2 |
| Developer B: | |
| Potassium srlcate (a 2 wt % aqueous solution) (SiO$_2$/K$_2$O molar ratio = 0.75) | 100 |
| C$_{10}$H$_7$—O—(C$_2$H$_4$O)$_7$—SO$_3$K | 5 |

The results obtained are listed in the following Table 1. In Table 1, "Contamination" means the contamination of non-image area of the printing plate during printing and "Printing Durability" means the number of acceptable copies obtained during practical printing operation. Moreover, after 10m$^2$ of the plate per one liter of the developer was processed, 25% of water in the exhausted developer was compulsorily evaporated to examine whether sludge was formed or not.

TABLE 1

| Ex. No. | Substrate | Underlying Coating | Developer | Contamination | Printing Durability | Sludge |
|---|---|---|---|---|---|---|
| 1 | A | phenyl phosphate | A | A | 100,000 | None |
| 2 | A | phenyl phosphonic acid | A | A | 100,000 | None |
| 3 | A | phenyl phosphinic acid | A | B | 90,000 | None |
| 1* | B | None | A | D | 100,000 | None |
| 2* | A | None | A | C | 5,000 | None |
| 3* | B | None | B | B | 100,000 | formed |

*: Comparative Example
Contamination: A = no contamination; B = almost no contamination C = slightly contaminated; D = greatly contaminated In Examples 1 to 3, there was not observed any scum. sludge formation during developing over a long time with an automatic developing machine and thus the exhausted developer could easily be neutralized. Moreover, developability was good, any contamination was not observed during printing operation and the printing plate had sufficient printing durability. On the other hand, in Comparative Example 1, there was not observed any scum. sludge formation, but contamination was observed during printing since the substrate had not been hydrophilized. In Comparative Example 2, contamination during printing was eliminated, but the printing durability was insufficient. Further, in Comparative Example 3, resistance to contamination and printing durability during printing were sufficient, but there was observed scum. sludge formation and clogging of the spray nozzle of the automatic developing machine was observed.

As seen from the foregoing, the method of the present invention can provide a lithographic printing plate having sufficient resistance to contamination and printing durability, the exhausted developer never causes scum. sludge formation even after the operation over a long time and accordingly the neutralization of the exhausted solution and exhaust of the used solution were easy and any problem of environmental pollution does not arise.

EXAMPLES 4 TO 6 AND COMPARATIVE EXAMPLES 4 TO 6

An aluminum plate (JIS A 1050) having a thickness of 0.30 mm was surface-grained with a nylon brush and an aqueous suspension of 400 mesh pumice stone and then sufficiently washed with water. After etching the plate with a 10% sodium hydroxide solution at 70° C.) for 60 seconds, the plate was washed with running water, neutralized and washed with a 20% $HNO_3$ solution and washed with water. The plate was then electrolytically surface-roughened at an anodic voltage (va) of 12.7 V such that the quantity of electricity at the anode time was 160 coulomb/$dm^2$ in a 1% aqueous nitric acid solution using a sinusoidal alternating waved current. At this stage, the surface roughness thereof was determined to be 0.6μ (Ra unit). Subsequently, the plate was immersed in a 30% sulfuric acid aqueous solution at 55° C. for 2 minutes for desmutting, then anodized at a current density of 2 A/$dm^2$ in a 20% aqueous sulfuric acid solution so that the resulting anodized layer was 2.7 g/$m^2$ and treated with a 2% aqueous sodium silicate solution at 70° C., for 20 seconds to give an aluminum substrate C.

An underlying coating solution having the following composition was applied onto the surface of substrate C thus treated and dried at 80° C. for 30 seconds. The coated amount thereof was 10 mg/$m^2$ (weighed after drying).

| Example 4: | naphthylphosphate | 0.05 part by weight |
|---|---|---|
|  | ethanol | 100 parts by weight |
| Example 5: | diphenylphosphinic acid | 0.05 part by weight |
|  | ethanol | 100 parts by weight |
| Example 6: | naphthylphosphonic acid | 0.05 part by weight |
|  | ethanol | 100 parts by weight |

Separately, substrates which had been processed in the same manner used above except that the final sodium silicate treatment was omitted (substrate D) were used without applying any underlying coating as comparative samples (Comparative Examples 4 and 6). Moreover, substrate C per se was used without applying any underlying coating as a comparative sample (Comparative Example 5). Then the following light-sensitive solution containing the following components was applied onto the substrates thus obtained. The coated amount thereof was 2.5 g/$m^2$ (weighed after drying).

| Light-sensitive Solution Component | Amount (part by weight) |
|---|---|
| Naphthoqunone-1,2-diazido-5-sulphonate ester of polyhydroxyphenyl obtained by condensing acetone and pyrogallol | 0.8 |
| Phenol-formaldehyde resin (weight-average molecular weight = 1,500) | 2.2 |
| Novolak type octyl phenol-formaldehyde resin | 0.02 |
| Phthalic anhydride | 0.08 |
| 2-trichloromethyl-5-(p-methoxystyryl)-1,3,4-oxadiazole | 0.04 |
| p-Toluene sulphonate salt of Crystal Violet | 0.03 |
| Methyl cellosolve acetate | 20 |
| Methyl ethyl ketone | 8 |

The resulting PS plates were imagewise exposed to light using PS Light (provided with a 2 KW metal halide lamp, available from Fuji Photo Film Co., Ltd.) and then developed with the following developer C (pH≈11.0) or D (pH≈13) at 25° C. for 30 seconds.

| Component | Amount (part by weight) |
|---|---|
| Developer C: Stock solution (which is diluted with water at a rate of 1/1 prior to use) | |
| Water | 1000 |
| Triethanolamine | 20 |
| Monoethanolamine | 5 |
| Pelex NBL | 30 |
| Developer D: | |
| Sodium silicate (a 2.5 wt % aqueous solution) (SiO2/Na2O molar ratio = 0.65) | 100 |
| $C_{10}H_7$—O—$(C_2H_4O)_4$—$SO_3Na$ | 8 |

The results obtained are listed in the following Table 2. In Table 2, "Contamination" means the contamination of non-image area of the resulting printing plate during printing and "Printing Durability" means the number of acceptable copies obtained during practical printing operation. Moreover, after 10 $m^2$ of the plate per one liter of the developer was processed, 25% of water in the exhausted developer was compulsorily evaporated to examine whether sludge was formed or not.

TABLE 2

| Ex. No. | Substrate | Underlying Coating | Developer | Contamination | Printing Durability | Sludge |
|---|---|---|---|---|---|---|
| 4 | C | naphthylphosphate | C | A | 90,000 | None |
| 5 | C | diphenylphosphinic acid | C | B | 80,000 | None |
| 6 | C | naphthylphosphonic acid | C | A | 90,000 | None |
| 4* | D | None | C | D | 90,000 | None |
| 5* | C | None | C | C | 3,000 | None |
| 6* | D | None | D | B | 90,000 | formed |

*: Comparative Example

In Examples 4 to 6, there was not observed any scum. sludge formation during developing over a long time with an automatic developing machine and thus the exhausted developer could easily be neutralized. Moreover, developability was good, any contamination was not observed during printing operation and the printing plate had sufficient printing durability. On the other hand, in Comparative Example 4, there was not observed any scum. sludge formation, but contamination was observed during printing since the substrate had not been hydrophilized. In Comparative Example 5, contamination during printing was eliminated, but the printing durability was insufficient. Further, in Comparative Example 6, resistance to contamination and printing durability during printing were sufficient, but there was observed scum. sludge formation during a long term processing with the automatic developing machine was observed.

As seen from the foregoing, the method of the present invention can provide a lithographic printing plate having sufficient resistance to contamination and printing durability, the exhausted developer never causes scum. sludge formation even after the operation over a long time and accordingly the neutralization of the exhausted solution and the discharge of the used solution were easy and any problem of environmental pollution does not arise.

EXAMPLE 7 TO 11 and COMPARATIVE EXAMPLES 7 TO 9

An underlying coating solution (I) having the following composition was applied onto the surface of substrate A prepared in Example 1 and dried at 90° C. for one minute. The coated amount thereof was 20 mg/m² (weighed after drying).

| Underlying Coating Solution (I) | |
|---|---|
| Phenylphosphate | 0.1 g (Example 7) |
| Methanol | 95 g |
| Water | 5 g |

In the same manner, substrates were prepared by applying, to substrates A, underlying coating solutions having the same compositions as that of solution (I) except that phenyl phosphonic acid (Example 8), naphthylphosphate (Example 9), phenyl phosphinic acid (Example 10) or diphenylphosphinic acid (Example 11) was substituted for the phenyl phosphate used in solution (I), in coated amounts of 20 mg/m² respectively.

Separately, a substrate free of underlying coating was prepared (Comparative Example 7). Further substrates which had been processed in the same manner used above except that the sodium silicate treatment was omitted (Comparative Example 9) and coated with the underlying coating solution (I) (Comparative Example 8). Then a light-sensitive solution having the following composition was applied onto the substrates thus obtained.

| Light-sensitive solution Component | Amount (part by by weight) |
|---|---|
| Ester of 2,3,4-trihydroxybenzophenone and naphthoquinone-1,2-diazide-5-sulfonyl chloride (rate of esterification: 90 mol %) | 0.47 |
| Phenol-formaldehyde resin (weight-average molecular weight: 2,300) | 1.15 |
| 2-(p-Methoxyphenyl)-4,6-bis(trichloromethyl)-s-triazine | 0.02 |
| Naphthoquinone-1,2-diazide-4-sulfonyl chloride | 0.01 |
| Ethyl Violet (a dye available from Hodogaya Chemical Co., Ltd.) | 0.016 |
| Megafac F-177 (fluorine atom-containing surfactant available from Dainippon Ink and Chemicals, Inc.) | 0.004 |
| Methyl ethyl ketone | 12 |
| Methanol | 4 |
| Ethylene dichloride | 4 |

The coated amount thereof was 2.1 g/m² (determined after drying). The PS plates were imagewise exposed to light from a 30A carbon arc lamp at a distance of 70 cm for 45 seconds and then developed with a developer (pH ≈ 10.5) containing the following components with an automatic developing machine at 25° C. for 30 seconds.

| Developer: Stock Solution (which is diluted with water at a rate of 1:4 prior to use) | |
|---|---|
| Component | Amount (part by weight) |
| Water | 75 |
| Potassium hydrogencarbonate | 3.5 |
| Potassium carbonate | 7 |
| Pelex NBL (available from Kao Atlas Co., Ltd.) | 20 |
| Phenyl cellosolve | 2 |

After the development, the plates were sufficiently washed with water, unnecessary portions were eliminated with an erasing solution followed by gumming up and printing in the usual manner. The retouching marks, remaining color stains and printing durability observed at this stage are listed in the following Table 3. As seen from the data listed in Table 3, the lithographic printing plate was excellent in all of the remaining color stain (R.Co.St.), contamination (Cont.) and printing durability (P. Du.) as compared with those observed in Comparative Examples.

TABLE 3

| Ex. No. | Substrate Anodization | Substrate Hydrophilization | Substrate Underlyng Coating | Retoughing Mark | R. Co. St.[1] | P. Du. |
|---|---|---|---|---|---|---|
| 7 | Yes | Yes | phenylphosphate | None | 0.01 | 100,000 |
| 8 | Yes | Yes | phenylphosphonic acid | None | 0.02 | 100,000 |
| 9 | Yes | Yes | naphthylphosphate | None | 0.01 | 100,000 |
| 10 | Yes | Yes | phenylphosphinic acid | None | 0.02 | 100,000 |
| 11 | Yes | Yes | diphenylphosphinic acid | None | 0.01 | 100,000 |
| 7* | Yes | Yes | None | slight | 0.04 | <10,000 |
| 8* | Yes | No | phenylphosphate | observed | 0.07 | 80,000 |
| 9* | Yes | No | None | observed (background contamination) | 0.15 | 120,000 |

*: Comparative Example.
[1] This is expressed in terms of the density difference (ΔD) between the non-image portion after the development and the substate before the coating.

EXAMPLES 12 TO 16 AND COMPARATIVE EXAMPLES 10 TO 12

An aluminum plate having a thickness of 0.30 mm was surface-grained with a nylon brush and an aqueous suspension of 400 mesh pumice stone and then sufficiently washed with water. After etching the plate with a 10% sodium hydroxide solution at 70° C. for 60 seconds, the plate was washed with running water, neutralized and washed with a 20% $HNO_3$ solution and washed with water. The plate was then electrolytically surface-roughened at an anodic voltage (Va) of 12.7 V such that the quantity of electricity at the anode time was 160 coulomb/dm² in a 1% aqueous nitric acid solution using a sinusoidal alternating waved current. At this stage, the surface roughness thereof was determined to be 0.6μ (Ra unit). Subsequently, the plate was immersed in a 30% sulfuric acid aqueous solution at 55° C., for 2 minutes for desmutting, then anodized at a current density of 2 A/dm² in a 20% aqueous sulfuric acid solution so that the resulting anodized layer was 2.7 g/m² and treated with a 2.5% aqueous sodium silicate solution at 70° C. for 30 seconds to give an aluminum substrate E. The same underlying coating used in Examples 7 to 11 and Comparative Samples 7 to 9 was applied onto the surface of substrate E thus treated in the same manner. Then the following light-sensitive solution containing the following components was applied onto the substrates thus obtained.

| Light-sensitive Solution Component | Amount (g) |
| --- | --- |
| Ester of 1,2-diazonaphthoquinone-5-sulfonyl chloride and pyrogallol/acetone resin (ester disclosed in Example 1 of U.S. Pat. No. 3,635,709) | 0.45 |
| Cresol/formaldehyde novolak resin (m-/p- ratio = 6/4; weight-average molecular weight = 3,000; number-average molecular weight = 1,100) | 1.1 |
| 4-[p-N-(p-Hydroxybenzoylamino)phenyl]-2,6-bis(trichloromethyl)-s-triazine | 0.02 |
| Tetrahydrophthalic anhydride | 0.05 |
| Victoria Pure Blue BOH (available from Hodogaya Chemical Co., Ltd.) | 0.02 |
| Megafac F-177 (fluorine atom-containing surfactant available from Dainippon Ink and Chemicals, Inc.) | 0.006 |
| Methyl ethyl ketone | 15 |
| 1-Methoxy-2-propanol | 15 |

The resulting PS plates were imagewise exposed, for 50 seconds, to light from a 3 KW metal halide lamp at a distance of 1 m through a positive transparency in a vacuum printing frame and then developed with a 4.5% aqueous solution of potassium silicate (pH 12.9) having a molar ratio: $SiO_2/K_2O$ of 1.5.

After the development, the plates were sufficiently washed with water and then gummed up and printing operation was performed in the same procedures used in Examples 7 to 11 and Comparative Examples 7 to 9. The results obtained are summarized in Table 4. The data listed in Table 4 clearly indicate that the lithographic printing plates obtained by the present invention are superior to those obtained by Comparative Examples.

TABLE 4

| Ex. No. | Substrate Anodization | Substrate Hydrophilization | Substrate Underlying Coating | Retoughing Mark | R. Co. St. | P. Du. |
| --- | --- | --- | --- | --- | --- | --- |
| 12 | Yes | Yes | phenylphosphate | None | 0.01 | 140,000 |
| 13 | Yes | Yes | phenylphosphonic acid | None | 0.02 | 140,000 |
| 14 | Yes | Yes | naphthylphosphate | None | 0.02 | 140,000 |
| 15 | Yes | Yes | phenylphosphinic acid | None | 0.02 | 140,000 |
| 16 | Yes | Yes | diphenylphosphinic acid | None | 0.01 | 140,000 |
| 10* | Yes | Yes | None | None | 0.03 | <10,000 |
| 11* | Yes | No | phenylphosphate | Almost None | 0.04 | 120,000 |
| 12* | Yes | No | None | slightly observed | 0.05 | 150,000 |

*: Comparative Example.

What is claimed is:

1. A method of making a lithographic printing plate comprising the steps of imagewise exposing to light a presensitized plate which comprises a surface roughened treated, anodized and alkali metal silicate treated aluminum substrate provided thereon with an organic layer comprising at least one compound selected from the group consisting of substituted or unsubstituted aliphatic or aromatic compounds represented by the following general formula:

$$R^1(PO(OH)_2)_n \qquad (I)$$

or

$$R^1(PO(OH)(R^2))_n \qquad (II)$$

wherein n is 1 or 2, if n is 1, $R^1$ and $R^2$ each represents a substituted or unsubstituted alkyl, alkoxy, aryloxy, aryl, acyl or acyloxy group and if n is 2, $R^1$ represents a substituted or unsubstituted alkylene or arylene group and $R^2$ is the same as that defined above, and a positive-working light-sensitive layer which comprises an o-quinonediazide compound and developing the exposed plate with an aqueous solution having a pH value of from more than 9 to less 11 which contains at least one basis compound selected from the group consisting of ammonium hydrogencarbonate, sodium carbonate, potassium carbonate, ammonium carbonate, sodium hydrogencarbonate, potassium hydrogencarbonate, monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine, and pyridine and the concentration of the basic compound in the developer ranges from 0.05 to 10% by weight.

2. The method of claim 1 wherein, in Formula (I) or (II), if n is 1, $R^1$ and $R^2$ each represents a substituted or unsubstituted alkyl having 1 to 14 carbon atoms, alkoxy having 1 to 14 carbon atoms aryloxy having 6 to 10 carbon atoms, aryl having 6 to 10 carbon atoms, acyl having 1 to 14 carbon atoms or acyloxy having 1 to 14 carbon atoms and if n is 2, $R^1$ represents a substituted or unsubstituted alkylene having 1 to 14 carbon atoms or arylene having 6 to 10 carbon atoms and $R^2$ is the same as that defined above, the substituent being selected from the group consisting of alkyl (only for the aryl group), aryl (only for the alkyl group), alkoxy, acyl, acyloxy, aryloxy, vinyl, hydroxyl, carboxyl, cyano and nitro groups and halogen atoms.

3. The method of claim 1 wherein the aryloxy group is a phenoxy, p-chlorophenoxy, p-methylphenoxy or pyridinyl group; the aryl group is a phenyl, o-tolyl, m-tolyl, p-tolyl or p-chlorophenyl group; the acyl group is a formyl, acetyl, propionyl or benzoyl group; and the acyloxy group is an acetoxy, propionyloxy or pivaloyloxy group.

4. The method of claim 1 wherein the compounds (I) and (II) are in the form of salts with alkali metal, calcium, cobalt, iron, nickel, manganese, magnesium, barium or copper.

5. The method of claim 1 wherein the compounds (I) and (II) are selected from the group consisting of phenylphosphonic acid, phenylphosphate, naphthylphosphonic acid, naphthylphosphate, glycerophosphonic acid, glycerophosphate, p-nitro phenylphosphonic acid, p-nitrophenylphosphate, p-methoxyphenylphosphonic acid, p-methoxyphenylphosphate, p-hydroxyphenylphosphonic acid, p-hydroxyphenylphosphate, p-tolylphosphonic acid, p-tolylphosphate, p-acetyl-phenylphosphonic acid, p-acetylphenylphosphate, p-cyanophenylphosphonic acid, p-cyanophenylphosphate, m-chlorophenylphosphonic acid, m-chlorophenylphosphate, methylphosphonic acid, methylenediphosphonic acid, ethylphosphonic acid, ethylenediphosphonic acid, 2-carboxyethylphosphonic acid, phosphonoacetic acid, 2-phenylethylphosphonic acid, 2-hydroxyethylphosphate, 1-hydroxyethane-1,1-diphosphonic acid, aminohexylphosphate, 2-methoxyethylphosphonic acid, 2-acetylethylphosphonic acid, glycine-N,N-bis(methylenephosphonic acid), phosphoserine, phosphothreonine acid, diphenylphosphinic acid, dimethylphosphinic, pyridoxal phosphate, phenylphosphine acid, naphthylphosphinic acid, p-nitrophenylphosphinic acid, p-methoxyphenylphosphinic acid, p-hydroxyphenylphosphinic acid, p-tolylphosphinic acid, p-acetylphenylphosphinic acid, bisnitrophenylphosphate, dioctyl phosphate, diisopropyl phosphate, dibutyl phosphate, dimethyl phosphate, diethyl phosphate, di-2-ethylhexyl phosphate, diphenyl phosphate, methylphosphinic acid, ethylphosphinic acid, diethylphosphinic acid, 2-carboxyethylphosphinic acid, 2-phenylethylphosphinic acid, 2-hydroxyethylphosphinic acid, 2-methoxyethylphosphonic acid and 2-acetylethylphosphinic acid.

6. The method of claim 1 wherein the compounds (I) and (II) are selected from the group consisting of phenylphosphonic acid, phenylphosphate, naphthylphosphonic acid, naphthylphosphate, phenylphosphinic acid, diphenylphosphinic acid and naphthylphosphinic acid.

7. The method of claim 1 wherein the organic layer is formed by applying, onto the substrate, a solution of the compounds (I) and/or (II) having a concentration ranging from 0.005 to 10% by weight and then drying.

8. The method of claim 1 wherein the organic layer is formed by dipping the substrate in a solution of the compounds (I) and/or (II) having a concentration ranging from 0.01 to 20% by weight at a temperature ranging from 20° to 90° C. for 0.1 second to 20 minutes, then washing and drying.

9. The method of claim 1 wherein the concentration of the solution ranges from 0.05 to 5% by weight, the temperature ranges from 25° to 50° C. and the dipping time ranges from 2 seconds to one minute.

10. The method of claim 1 wherein the organic layer is coated in an amount ranging from 2 to 20 mg/m$^2$ expressed in terms of the dry weight thereof.

11. The method of claim 10 wherein the coated amount of the organic layer ranges from 5 to 100 mg/m$^2$ expressed in terms of the dry weight thereof.

12. The method of claim 1 wherein the organic layer comprises the compounds (I) and/or (II) in an amount of not less than 30% by weight.

13. The method of claim 12 wherein the organic layer comprises the compounds (I) and/or (II) in an amount of not less than 80% by weight.

14. The method of claim 1 wherein the o-naphthoquinonediazide compound is a compound obtained by reacting a polyhydroxy compound having a molecular weight of not more than 1,000 with 1,2-diazonaphthoquinonesulfonic acid chloride and the amount thereof in a light-sensitive composition for forming the light-sensitive layer ranges from 10 to 50% by weight.

15. The method of claim 14 wherein the light-sensitive composition comprises an alkali-soluble polymer having a carboxylic acid value ranging from 0 to 4 meq/g in an amount of not more than 80% by weight on the basis of the total weight of the composition.

16. The method of claim 14 wherein the composition comprises a cyclic acid anhydride, a phenol and/or an organic acid in an amount ranging from 0.05 to 15% by weight on the basis of the total weight of the composition and/or non-ionic and/or amphoteric surfactants in an amount ranging from 0.05 to 15% by weight on the basis of the total weight of the composition.

17. The method of claim 1 wherein the developer comprises an anionic surfactant in an amount ranging from 0.1 to 5% by weight on the basis of the total weight of the developer practically used.

18. The method of claim 1 wherein the developer comprises an organic solvent having a solubility in water of not more than about 10% by weight in an amount ranging from 1 to 5% by weight on the basis of the total weight of the developer practically used.

* * * * *